(12) United States Patent
Ghanadan et al.

(10) Patent No.: US 6,639,463 B1
(45) Date of Patent: Oct. 28, 2003

(54) ADAPTIVE POWER AMPLIFIER SYSTEM AND METHOD

(75) Inventors: Reza Ghanadan, Berkeley Heights, NJ (US); Kyriaki Konstantinou, Madison, NJ (US); Mohan Patel, Edison, NJ (US); Anthony A. Triolo, Succasunna, NJ (US); Norman Gerard Ziesse, Chester, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/645,117

(22) Filed: Aug. 24, 2000

(51) Int. Cl.[7] .............................. H03F 3/68; H03F 1/14; H03F 3/60
(52) U.S. Cl. ..................... 330/124 R; 330/51; 330/53
(58) Field of Search ................... 330/51, 53, 124 R

(56) References Cited

U.S. PATENT DOCUMENTS

| | | | |
|---|---|---|---|
| 4,016,503 A | | 4/1977 | Rambo .................... 330/124 |
| 4,198,611 A | * | 4/1980 | Eng |
| 4,422,048 A | * | 12/1983 | Edwards ................... 330/109 |
| 4,435,679 A | * | 3/1984 | Bedard et al. ............. 323/268 |
| 4,801,890 A | * | 1/1989 | Dolby ....................... 330/126 |
| 4,893,093 A | * | 1/1990 | Cronauer et al. |
| 5,068,620 A | * | 11/1991 | Botti et al. .................... 330/2 |
| 5,304,943 A | * | 4/1994 | Koontz |
| 5,872,481 A | * | 2/1999 | Sevic et al. |
| 5,886,573 A | | 3/1999 | Kolanek ..................... 350/10 |
| 6,128,479 A | * | 10/2000 | Fitzpatrick et al. |
| 6,137,355 A | * | 10/2000 | Sevic et al. |

FOREIGN PATENT DOCUMENTS

| | | | | |
|---|---|---|---|---|
| EP | 0443484 A1 | 2/1991 | ............ | H01P/5/04 |
| EP | 0664607 A2 | 8/1991 | ............ | H03F/3/217 |
| EP | 0762632 A1 | 8/1996 | ............ | H03F/3/21 |

* cited by examiner

Primary Examiner—Patricia Nguyen

(57) ABSTRACT

A power amplifier system uses adaptive distribution of signals through an amplifier architecture of parallel amplifier stages. For example, the power amplifier system can adjust the operation of individual amplifier stages in the amplifier arrangement, for example to reduce power handling capability of the amplifier stages based on information of the signal to be amplified by the amplifier arrangement, such as the power level. To take advantage of the adjusted operation of the amplifier stages, the power amplifier system uses a variable power divider to reapportion the input signal power among the amplifier stages and at least one variable combiner to adaptively combine amplified signals from the amplifier stages in changing proportions. As such, the power amplifier system is reconfigurable and/or can adapt to changing conditions to provide improved performance and/or efficiency.

23 Claims, 3 Drawing Sheets

ADAPTIVE POWER AMPLIFIER SYSTEM AND METHOD

BACKGROUND OF THE INVENTION

1. Field of The Invention

This invention relates to amplifiers and, more particularly, to an adaptive power amplifier architecture.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, a power amplifier, however, has a transfer function with nonlinear and "linear" regions. Whether the power amplifier is operating in a linear or nonlinear region depends on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the amplifer is being overdriven, and the output signal is clipped or distorted in a nonlinear fashion. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios. (PAR). For example, in a time division multiple access (TDMA) system, when multiple carriers signals are combined for amplification with a power amplifier, the resulting PAR is about 9 dB for a large number of carriers. In a code division multiple access (CDMA) system, a single loaded 1.25 Mhz wide carrier can have a PAR of 11.3 dB. These signals have to be amplified fairly linearly to avoid generating ACP. To satisfy the linearity requirement, power amplifiers are usually operated in Class A and Class AB configurations. To be able to handle large signal peaks linearly, the amplifiers are biased at high bias currents. The efficiency of the amplifiers is low because of the high bias and the high peak to average power ratios.

Accordingly, efficiency of the amplifier is inversely related to the ability to handle high peaks in a linear fashion. To achieve a high degree of linearity, the amplifiers are biased to operate, in class A or "slight" class AB (meaning class AB operation that is closer to class A than to class B). Maximum theoretical AC to DC efficiency achievable for class A operation is 50%, whereas that of a class AB amplifier is between 50 and 78.5% (the latter representing the maximum efficiency of a class B amplifier). The closer the particular class AB operation is to class A, the lower the maximum efficiency. For amplifiers employing field effect transistors, the class of operation is set in accordance with the gate voltage applied, which controls the quiescent (idle) drain current. For class A operation, the gate voltage is set so that the idle drain current is approximately in the middle of the range between pinch-off and saturation. Class B amplifiers are biased near pinch-off, resulting in a rectified drain current waveform. Class AB amplifiers are biased in between the bias points of classes A and B.

Typically, strict linearity requirements in modern wireless communication systems dictate the use of the relatively inefficient class A or slight class AB modes. As a result, significant DC power is dissipated by the amplifiers, thereby generating heat which must be controlled to avoid degrading amplifier performance and reliability. Hence, the use of elaborate heat sinks and fans become a necessary by-product of the high linearity system. Naturally, these measures add to the cost, size and weight of the base station equipment. As the number of wireless communications users continues to grow, so do the number of base stations and the need to keep them small, light and inexpensive. Thus, a great deal of research has focused on the quest to improve amplifier efficiency in these and other systems.

Various methods are used to enable the use of more cost-effective and more power efficient amplifiers while maintaining an acceptable level of linearity. Feed-forward correction is routinely deployed in modern amplifiers to improve the linearity of the main amplifier with various input patterns. The essence of the feed forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path. Pre-distortion techniques distort the input signal prior to amplification by taking into account the transfer function characteristics for the amplifier. As such, the desired amplified signal is achieved from the pre-distorted input signal. A technique described by Adel A. M. Saleh and Donald C. Cox, "Improving the Power-Added Efficiency of FET Amplifiers Operating with Varying Envelope Signals," IEEE Transactions On Microwave Theory and Techniques, Vol. 31, No. 1, January 1983 uses the input signal envelope to dynamically adjust the amplifier bias such that a high bias is only applied when a large peak is encountered. Baseband processing techniques can also be used to improve the efficiency and/or linearity of the power amplifier architecture.

Wireless base stations use a variety of radio frequency (RF) amplifers in both single carrier and multicarrier configurations operating in Class A and Class AB modes. FIG. 1 shows a typical feed-forward power amplifier architecture 10 which includes a main amplifier 12 to amplify the input signal on the main signal path 13 and a correction amplifier 14 used in reducing the distortion produced from the main amplifier 12. In performing feed forward correction, the distortion generated by the amplifier 12 is isolated on a distortion cancellation path 16. To isolate the distortion on the distortion cancellation or feed forward path 16, a coupler 17 provides a version of the amplified input signal and distortion from the output of the main amplifier 12 onto a coupling path 18 to a coupler 19. A coupler 20 provides a version of the input signal from the main signal path 13 to the coupler 19. The coupler 19 combines the amplified input signal and distortion from the coupling path with the version of the input signal from the feed forward path 16. As such, the input signals cancel and the distortion is left on the distortion cancellation path 16. The distortion is provided to the correction amplifier 14 which amplifies the distortion on the distortion cancellation path 16. A combiner 22 cancels the distortion on the main signal path 13 with the distortion on the distortion cancellation path 16 to reduce the distortion produced from the main amplifier 12.

Other power amplifier architectures are possible which use different structures and do not use a correction amplifier 14 as described above to reduce the nonlinear distortion of the signal. For example, the correction amplifier 14 can be replaced with a second amplifier or amplifiers in an arrangement where the amplifiers amplify versions of the original signal, and the amplified versions of the original signal are combined to produce the amplified signal while producing reduced distortion. For example, U.S. Pat. No. 5,917,375 issued on Jun. 29, 1999 entitled "Low Distortion Amplifier Circuit with Improved Output Power" describes a power amplification architecture using multiple amplifiers.

In the embodiment of FIG. 1, the main amplifier 12 is configured as parallel amplifier stages of like amplifiers to provide the same gain as the individual amplifiers while increasing the output; power of the main amplifier 12 with each amplifier stage 26a–d. The main amplifier 12 includes an arrangement of 1:2 splitters 24a–c which split the input signal among parallel amplifiers 26a–d. An arrangement of 2:1 combiners 28a–c combines the outputs of the parallel amplifiers 26a–d to produce an amplified signal on the main signal path 13. The main amplifier 12 has the same gain as an individual amplifier 26a–n but the power handling capability of the main amplifier 12 is increased by the power handling capability of each individual amplifier 26a–d.

In the described feed forward architecture, the main amplifier 12 is the largest single contributor to the overall power consumption in CDMA, TDMA and frequency division multiple access (FDMA) base stations. Due to the potential for high peak powers, the main amplifier 12 is biased with a high current to be able to handle those peak powers when they do occur. As such, the efficiency of the main amplifier 12 is typically less than 30%. This low efficiency leads to higher power consumption, shorter battery backup time, lower overall reliability and higher operating temperatures. Accordingly, there is a need for a more efficient power amplifier architecture.

SUMMARY OF THE INVENTION

The present invention involves a power amplifier system using adaptive distribution of signals through an amplifier architecture of parallel amplifier stages. For example, the power amplifier system can adjust the operation of individual amplifier stages in the amplifier arrangement, for example to reduce power handling capability of the amplifier stages based on information of the signal to be amplified by the amplifier arrangement, such as the power level. To take advantage of the adjusted operation of the amplifier stages, the power amplifier system uses a variable power divider to reapportion the input-signal power among the amplifier stages and at least one variable combiner to adaptively combine amplified signals from, the amplifier stages in changing proportions. As such, the power amplifier system is reconfigurable and/or can adapt to changing conditions to provide improved performance and/or efficiency.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
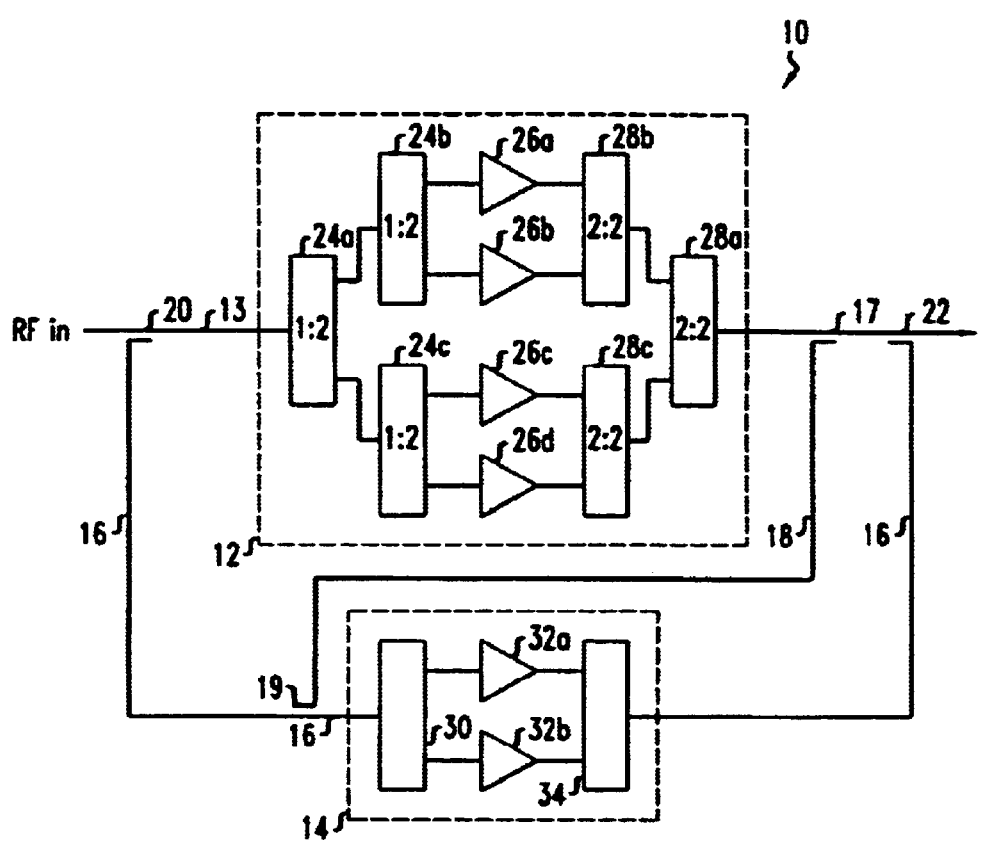
FIG. 1 shows a power amplifier architecture using parallel amplifier stages in the main amplifier.
Figure 2:
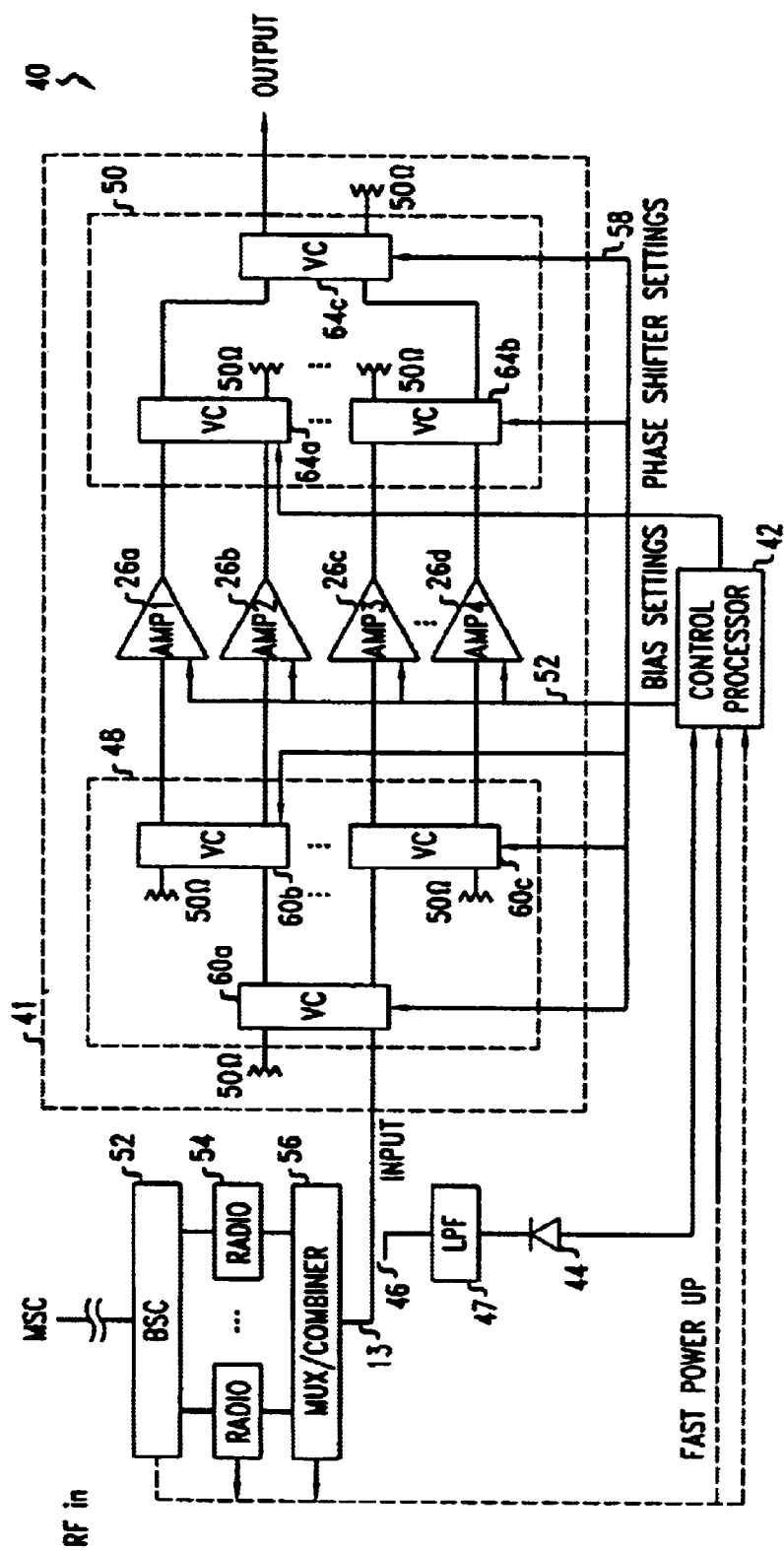
FIG. 2 shows the power amplifier architecture using the adaptive power amplifier system according to the principles of the present invention.

An illustrative embodiment of an adaptive power amplifier system according to the principles of the present invention is described. FIG. 2 shows a general block diagram of a multiple stage amplifier architecture 40 in which the operation, such as the power handling capability, of a main amplifier 41 is changed by controlling the operation of individual amplifier stages 26a–d along with the signal power distribution and amplified signal combining. In this embodiment, the main amplifier 41 has parallel amplifier stages 26a–d. Processing circuitry 42 receives or obtains amplifier control information, for example upstream signal power detection information from a power detector 44 receiving a replica of the signal on the main signal path 13 from a coupler 46 and low pass-filtered by a filter 47 to produce a signal representing the power, such as the total average power or peak power, of the signal on the main signal path 13 to be amplified by the amplifier 12. In response to the control information or in response to a change in operation of the amplifier stage(s), the processing circuitry 42 provides control signal(s) to a variable power dividing network 48 to reapportion or provide changing portions or proportions of the input signal power among the amplifier stages 26a–d.

After the portions of the input signal are amplified, a variable combining network 50 constructively combines the amplified signal portions such that the amplified signal portions from the amplifier stages are a changing portion or proportion of the amplified output signal. As such, the adaptive power amplifier system can redistribute the signal power among the amplifier stages and recombine the redistributed amplified power in corresponding portions or proportions to provide more efficient or improved performance. Portions can refer to replicas or signal components of the input signal or of the amplified signal, a signal composed of phase-shifted versions or signal components of the input signal or of the amplified signal, or phase-shifted versions of replicas or signal components of the input signal which have been produced by the divider network 48 (FIG. 2) and amplified. Depending on the context, portions, replicas and/or signal components can be synonymous or can be produced from a coupling, division or combination of portions, replicas and/or signal components. Portions can also refer to signal components, replicas or signal portions relative to an input signal, output signal or other portion, for example a ratio or proportion of the portion relative to the input signal, the output signal or another portion.

Depending on the embodiment, the control information received or obtained by the processing circuitry 42 can include the upstream signal configuration information, the upstream signal power information and/or other control information. Additionally or alternatively, the processing circuitry 42 can receive other signal information which describes the signal to be amplified without directly performing measurements on the main signal path 13, for example information on the composition, component signals and structure for the signal to be amplified, such as the number of carriers comprising the signal to be amplified, the type of carriers (for example, CDMA, TDMA or FDMA)

and/or the number of users for which the signal is produced. The amplifier control information can be provided by a base station controller (BSC) 52, the radio circuitry 54 and/or the switching/combining circuitry 56 (MUX) to the processing circuitry 42. The processing circuitry 42 or portions thereof can be located in the BSC 52, the radio circuitry 54 and/or the switching/combining circuitry 56 (MUX). The processing circuitry 42 can receive control signals to adapt the operation of the amplifier 41, for example a fast power up control signal.

In this embodiment, the processing circuitry 42 can provide control signal(s) 52 to control the operation of the amplifier stages 26a–d of main amplifier 12. The processing circuitry 42 can provide bias current adjustments to the amplifier stages 26a–d to adjust the operation of individual amplifier stages 26a–d, for example to turn "on" or "off" amplifier stages 26a–d in the main amplifier 41. Depending on the embodiment, the processing circuitry 42 can adjust at least one operating characteristic of the amplifier 41 based on the control information or in response to the shutting down or malfunctioning of the amplifier stage(s). For example, the processing circuitry 42 adjusts the bias voltage(s) and/or source voltage(s) to the amplifier stages 26a–d to change at least one operating characteristics of the amplifier stage(s) 26a–d and/or the amplifier 41. The operating characteristics of the amplifier 41 and/or the amplifier stage(s) 26a–d can include the power handling capability, such as the peak power handling capability, the class of operation of the amplifier 41 and/or amplifier stages(s) 26a–d, and/or the portion of the transfer function in which the amplifier 41 and/or the amplifier stage(s) 26a–d operates.

For example, if each individual amplifier 26a–d has 100 watts of power handling capability, the main amplifier 12 has 100 watts multiplied by the number of parallel power amplifier stages of power handling capability. As such, the main amplifier 12 can handle peak powers of 400 watts. If the detected power level of the signal to be amplified is below a particular level, for example 300 watts, the processing circuitry 42 can provide control signal(s) to amplifier stages 26a–d to shut-off an amplifier or amplifiers, for example amplifier 26d. An amplifier stage 26a–d can be shut-down by cutting off the source voltage and/or the bias voltage. By shutting off an amplifier or amplifiers, the power amplifier efficiency (output power over DC power consumed) is improved because the output power effectively remains the same while the DC power consumed is reduced.

In response to the control information or in response to the turning off of amplifier stage(s), the processing circuitry 42 can provide control signal(s) 57 to a variable power dividing network 48 to redistribute the signal power among the active amplifier stage(s) 26a–d. The processing circuitry 42 can provide control signals 57 to the variable power dividing network 48 to reapportion the signal power among the amplifier stages 26a–d. The processing circuitry 42 can also provide control signals 58 to the variable combining network 50 to recombine the outputs of the amplifier stages 26a–d in changing proportions relative to the amplified output signal, for example in proportions reflecting the changing proportions of signal power being distributed to the amplifier stages 26a–d.

In this embodiment, the power dividing network 48 is an arrangement of 1:2 variable power dividers 60a–c. Each divider 60a–c can split the signal received at its input into two replicas of the received signal having varying proportions of the power from the received signal. For example, each splitter can split the received signal into two replicas of the received signal at one-half the power of the received signal, or the power divider can vary the portions of the received signal such that a replica of the received signal at full power (minus some small attenuation) is provided at one of the two output ports while the signal is not provided (or at, a very low power level) at the other output port. Each power divider 60a–c can produce replicas, components or portions of the received signal at varying ratios or changing portions or proportions relative to the full received signal power. Variable dividers can be arranged to form a single, variable divider with more output ports. In this embodiment, for each divider 60a–c, a fourth port on each power divider 60a–c is shown with a 50 ohm load for impedance matching. As little power as possible (ideally, no power) should be provided to the 50 ohm load.

If the amplifier stage 26d is shut-down, the processing circuitry 42 provides control signals 57 to the power divider 48 to redistribute the power among the active amplifier stages 26a–c for amplification. For example, the control signals could vary the distribution of the signal power of the input signal to the power divider 60a such that a replica of the input signal at ⅔ of the power is provided at one output port to the power divider 60b and a replica of the input signal at ⅓ of the signal power is provided at the other output port to the power divider 60c. The control signal to the power divider 60b can vary the power distribution such that the power of the ⅔ power signal is divided equally among the output ports to the amplifier stages 26a–b. Accordingly, the amplifier stage 26a replica of the input signal at ⅓ the power, and the amplifier stage 26b receives a replica of the input signal at ⅓ the power. The input signal at ⅓ power provided by the power divider 60a to the power divider 60c is provided at the full ⅓ power (with some small attenuation possible) to the amplifier stage 26c for amplification while no power is provided to the inactive amplifier 26d.

After amplification, the variable combining network 50 combines the amplified replicas, components or portions of the input signal from the active amplifier stages 26a–c and combines them reflecting the portion(s) of signal power used in distributing the input signal power among the amplifier stages 26a–d to provide the amplified signal at the desired level. In this embodiment, the combining network 50 is an arrangement of 2:1 variable combiners 64a–c. Each variable combiner 64a–c can combine the amplified portions using varying proportions of the received amplified portions to provide the combined output signal. For example, each power divider 64a–c can combine the power of each of the received amplified portions, or the power combiner 64a–c can vary the portions such that the combined output of the received signal is made up almost entirely (minus some small attenuation) of the power from the amplified portion at one of the two input ports. Each power combiner 64a–c can produce combined signals constructed using varying or changing ratios, portions or proportions relative to the powers of the signals at the input ports and/or at the output port. Variable combiners can be arranged to form a single variable combiner with more input ports. In this embodiment, for each combiner 64a–c, a fourth port on each power combiner 64a–c is shown with a 50 ohm load for impedance matching. As little power as possible (ideally, no power) should be directed to and dissipated by the 50 ohm load.

In this embodiment, the processing circuitry 42 provides control signals 58 to the power combiner 50 to combine the power from the active amplifier stages 26a–c such that the signals input to the variable combiner network 50 constructively combine in varying proportions to produce the amplified output signal. For example, control signals to the variable combiner 64a could vary the combining of the amplified signal portions from the amplifier stages 26a–b to combine the amplified signal portions equally at the output to the variable combiner 64a to the variable combiner 64c. The control signals to the power combiner 64b can vary the power combining such that the power of the amplified signal portion from the active amplifier stage 26c makes up the full portion, for example ideally 100%, of the combined output signal at the output of the variable combiner 64b to the variable combiner 64c. In accordance with the example above if the amplifier stage 26d is inactive and if the amplifier stages are operating in the same fashion, the output from the variable combiner 64a has a power level that is about twice that of the output of the variable combiner 64b. The variable combiner 64c receives the outputs from the variable combiners 64a and b and constructively combines the signals such that the signal from the variable combiner 64a makes up twice amount of the amplified output signal than the amount of the signal output from the variable combiner 64c.

In an alternative example, if the power level of the signal to be amplified is even lower than in the example above, for example below a second threshold level (such as 200 watts or 50% of the total peak:power handling capability of the amplifier 441), the processing circuitry 42 can shut-off additional amplifiers, for example the amplifiers 26c–d. In this embodiment with four similar or the same parallel amplifier stages 26a–d with the same operating characteristics, the peak power handling capability of the amplifier 41 can be adjusted by 25% increments. If the amplifier 41 has six parallel amplifier stages operating with the same operating characteristics; the peak power handling capability of the amplifier 12 could be adjusted in 16.7% increments by turning off or on amplifier stages.

If the amplifier stages 26c–d are shut off, the processing circuitry 42 can provide control signal(s) 57 to the power dividing network 48, for example to variable divider 60a, such that the input signal power is produced at ideally 100% to the variable divider 60b for the active amplifiers 26a–b while no power is provided to the variable divider 60c for the inactive amplifier stages 26c–d. In this embodiment, the processing circuitry 42 provides control signals to the variable divider 60b such that the power from the variable divider 60a is apportioned equally among the active amplifiers 26a–b for amplification. After amplification, the combining network 50 responds to control signals from the processing circuitry 42 to combine the amplified portions from the active amplifiers 26a–b , for example using the variable combiner 64a to constructively combine the amplified signals from the amplifiers 26a–b in equal portions and produce the resulting signal to the variable combiner 64c. The variable combiner 64c uses the entire portion or ideally 100% (minus losses in the transmission lines and cables) of the signal output from the variable combiner 64a as the amplified output signal produced from the variable combiner 64c.

Figure 3:
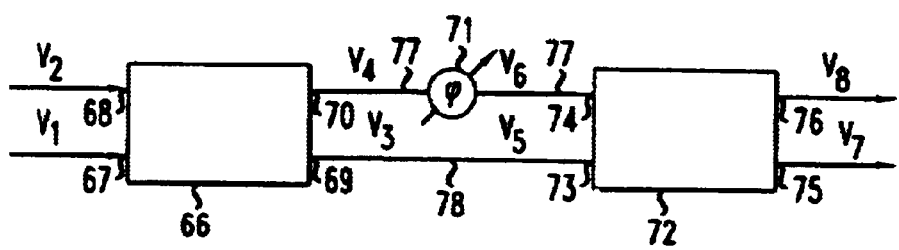
FIG. 3 shows a variable coupler which can be used in the adaptive power amplifier system according to principles of the present invention.

In this embodiment, the variable dividers 60a–c of the variable dividing network 48 and the variable combiners 64a–c of the variable combining network 50 are variable coupler arrangements which can change the distribution of power of the signals between the input ports and the output ports. FIG. 3 shows a variable coupler arrangement 65 comprising a first coupler 66 which phase shifts and combines the signals at first and second input ports 67 (V1) and 68 (V2) to produce combined signal portions at first and second outputs 69 (V3) and 70 (V4). A phase shifter 71 provides a relative phase adjustment between the combined signal components or portions at the ports 69 (V3) and 70 (V4) to provide the desired coupling between the combined signal portions or components by a second coupler 72. The second coupler 72 phase shifts and combines the combined signal portions or components at first and second input ports 73 (V5) and 74 (V6) such that the combination of the combined signal components or portions at the first and second output ports 75 (V7) and 76 (V8) of the coupler 72 combine having a desired amplitude and/or phase relationship between them. For example, the combined signal portions can be re-combined to produce at the output port signal a replica of the signals at the input ports 67 and 68 using varying power portions or proportions of the input signals depending on the phase shift introduced by the phase shifter 71.

In this embodiment, the coupler 66 is a 3 dB 90 degree hybrid coupler in which the signal (at one-half power) at the first input port 67 is combined at the first output port 69 with a 90 degree phase shifted version (at one-half power) of signal at the second input port 68. The signal at first input port 67 (at one-half power) is phase shifted by 90 degrees and combined at the second output port 70 with the signal (at one-half power) at the second input port 68. In this embodiment, the phase shifter 71 is on the path 77 and provides a relative phase adjustment between the combined signal portions on the path 77 from the port 70 and the combined signal portions on a path 78 from the port 69. The phase shifter 71 can be implemented mechanically, for example with a switch to different phase lines or electronically, for example using variable capacitors or varactors, and can be positioned on the path 77 in other embodiments.

The phase shifter 71 provides the phase-adjusted combined signal components or portions on the path 77 to a second input port 74 of the second coupler 72, which in this embodiment is also a 3 dB 90 degree hybrid coupler. A portion of the combined signal components or portions at the input port 73 is directed to the output port 75 of the second coupler 72 and phase shifted by 90 degrees along with the combined signal components or portions at the input port 73 (at one-half power) of the second coupler 72. A portion of the combined signal components or portions at the input port 74 is phase shifted by 90 degrees and directed to the output port 75 of the second coupler 72 along with a portion of the combined signal components or portions at the input port 73 of the second coupler 72. A portion of the combined signal components or portions at the input port 73 of the second coupler 72 is directed to the output port 75 of the second coupler 72 along with a portion of the combined signal components or portions at the input port 74 phase-shifted by 90 degrees.

Those portions of the combined signals components or portions which are in phase at the first or second output ports 75 or 76 are constructively combined at the output port 75 or 76. When the portions of the combined signal components are out of phase at the first or second output port 75 or 76, those portions of the combined signal components which destructively combine do not dissipate power, and the power remains for the other first or second output port 128 or 132. As shown in the equations below, the phase shifter 71 can provide a relative phase shift between the combined signals on the paths 77 and 78 to change the power (or voltage) distribution between the input ports 67 and 68 and the output ports 75 and 76. For example, where V1 and V2 represent the voltages of the signals at the input ports 67 and 68 respectively and $\theta$ is the phase shift introduced by the phase shifter 71, the operation, of the variable coupler 65 can be characterized by the following equations.

$$V3 = \frac{V1}{\sqrt{2}} + \frac{V2}{\sqrt{2}}e^{j90} = V5,$$

$$V4 = \frac{V1}{\sqrt{2}}e^{j90} + \frac{V2}{\sqrt{2}}$$

$$V6 = \left(\frac{V1}{\sqrt{2}}e^{j90} + \frac{V2}{\sqrt{2}}\right)e^{j\theta},$$

$$V7 = \frac{V5}{\sqrt{2}} + \frac{V6}{\sqrt{2}}e^{j90} = \frac{V1}{2} + \frac{V2}{2}e^{j90} + \left(\frac{V1}{2}e^{j90} + \frac{V2}{2}\right)e^{j\theta}e^{j90}, \text{ and}$$

$$= \frac{V1}{2} + \frac{V2}{2}e^{j90} + \frac{V1}{2}e^{j180}e^{j\theta} + \frac{V2}{2}e^{j90}e^{j\theta}$$

$$V8 = \frac{V5}{\sqrt{2}}e^{j90} + \frac{V6}{\sqrt{2}} = \left(\frac{V1}{2} + \frac{V2}{2}e^{j90}\right)e^{j90} + \left(\frac{V1}{2}e^{j90} + \frac{V2}{2}\right)e^{j\theta}$$

$$= \frac{V1}{2}e^{j90} + \frac{V2}{2}e^{j180} + \frac{V1}{2}e^{j90}e^{j\theta} + \frac{V2}{2}e^{j\theta}$$

Accordingly, if the phase shifter 71 introduces a phase shift of 0 degrees, then V7=V2$^{j90}$ and V8=V1. If the phase shifter 70 introduces a phase shift of 180 degrees, then V7=V1 and V8=V2. If the phase shifter 71 introduces a phase shift of 90 degrees, then $$V7 = \frac{V1}{2} + \frac{V1}{2}e^{j270} + \frac{V2}{2}e^{j90} + \frac{V2}{2}e^{j180} \text{ and}$$

$$V8 = \frac{V1}{2}e^{j90} + \frac{V1}{2}e^{j180} + \frac{V2}{2}e^{j90} + \frac{V2}{2}e^{j180}.$$

By providing a termination, such as a 50 ohm termination, at an input port 67 or 68, the variable coupler arrangement 65 can be operated as a variable divider, where V1 or V2 is equal to 0. By providing a termination, such as a 50 ohm termination, at an output port 75 or 76, the variable coupler arrangement 65 can be operated as a variable combiner, where V7 or V8 is the output port.

Figure 4:
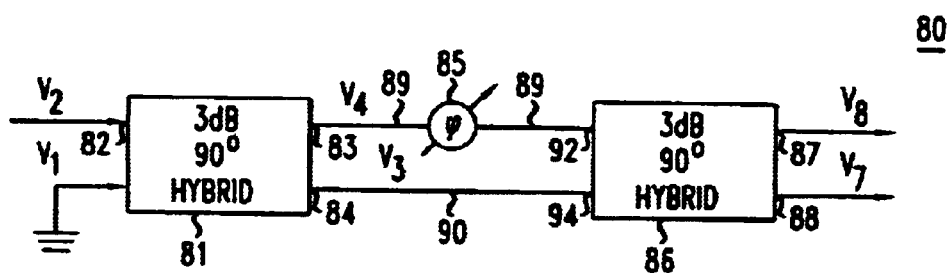
FIG. 4 shows a variable divider which can be used in the adaptive power amplifier system according to the principles of the present invention.

FIG. 4 shows an embodiment of a variable divider 80 which can be used in the amplifier network 40 of FIG. 2 as a variable divider 60*a–c*. A coupler 81 receives an input signal at a port 82 (V2) with a power level P and produces replicas of the input signal at ports 83 and 84. A phase shifter 85 provides a relative phase adjustment between the replicas of the input signal at the ports 83 and 84 such that the combination of the replicas at a coupler 86 provides the desired power levels (or voltage levels) for the combined signal replicas of the input signal at the output ports 87 (V8) and 88 (V7). In this embodiment, the coupler 81 is a 3 dB 90 degree hybrid coupler which produces a replica of the signal at the port 83 (V4) in-phase with the input signal but having a power level P/2 on a path 89. The coupler 81 also produces a replica of the input signal at the port 84 (V3) which is phase-shifted by 90 degrees and having a power level P/2 on a path 90. In this embodiment, the phase shifter 85 is on the path 89 and provides a relative phase adjustment between the replicas of the signals on the paths 89 and 90 by adjusting the phase of the replica on the path 89. The phase shifter 85 can be implemented mechanically, for example with a switch to different phase lines or electronically, for example using variable capacitors or varactors.

The phase shifter 85 provides the phase-adjusted replica on the path 89 to a port 92 of the coupler 86, which in this embodiment is a 3 dB 90 degree hybrid coupler. A portion (½ of the power of the signal on the path 89 or P/4 in this embodiment) of the power of the signal at the port 92 is directed to the output port 87 (V8) of the coupler 86 along with a portion (½ of the power of the signal on the path 90 or P/4) of the power of the signal at the port 94 which has been shifted by 90 degrees. A portion (½ of the power of the signal on the path 89 or P/4 in this embodiment) of the power of the signal at the port 92 delayed by 90 degrees is directed to the output port 88 (V7) of the coupler 86 along with a portion (½ of the power of the signal on the path 90 or P/4) of the power of the signal at the port 94. The voltage from those portions of the replicas which are in phase at the output port 87 or 88 are constructively combined and produced at the output port 87 or 88, respectively. When the voltages from the portions of the replicas are out of phase at the output port 87 or 88, those portions of the replicas are respectively cancelled and dissipate no power. As such, the signal portions or components at the input port 92 are combined with signal portions or components at the input port 94 such that the combination of the signal portions or components at the coupler 86 provides replicas of the input signals at the desired power levels at the output ports 87 and/or 88.

In the operation of the embodiment of FIG. 4, if the phase shifter 85 introduces a 0 degree phase shift to the replica of the input signal (V2) at the port 83, a replica of the input signal (V2) on the path 89 is provided to the port 92 of the coupler 86 with zero degrees of phase shift and a power level of P/2. A replica of the input signal from V2 with a power level of P/2 is provided to the port 94 with a 90 degree phase shift. The signal at the port 92 is split and distributed within the coupler 86 to the output ports 87 and 88. A portion of the signal is provided to the output port 87 with 0 degrees of phase shift, and a portion of the signal is provided to the output port 88 with a phase shift of ninety degrees. The signal at the input port 94 is also split and distributed to the output ports 87 and 88. A portion of the signal is provided to the output port 88 without being phase shifted for a total phase shift of 90 degrees, and a portion of the signal is provided to the output port 87 after being phase shifted by ninety degrees for a total phase shift of 180 degrees. At the output port 88, the signal portions from the ports 92 and 94 which are 90 degrees in phase constructively combine to produce a replica of the input signal (V2). At the output port 87, the replicas of the input signal are 180 degrees out of phase and interact to dissipate no power. Thus, the power level at the output port 87 is 0, and the power level at the output port 88 is P.

If the phase shifter 85 introduces a 180 degree phase shift to the replica of the input signal (V2) at the port 83, the replica of the input signal (V2) on the path 89 is provided to the port 92 of the coupler 86 with 180 degrees of phase shift and a power level of P/2. A replica of the input signal with a power level of P/2 is provided to the port 94 with a 90 degree phase shift the signal at the port 92 is split and distributed within the coupler 86 to the output ports 87 and 88. A portion of the signal is provided to the output port 87 with 180 degrees of phase shift, and a portion of the signal is provided to the output port 88 with a phase shift of ninety degrees for a total phase shift of 270 degrees. The signal at the port 94 is also split and distributed to the output ports 87 and 88. A portion of the signal is provided to the output port 88 without being phase shifted for a total phase shift of 90 degrees, and a portion of the signal is provided to the output port 87 after being phase shifted by ninety degrees for a total phase shift of 180 degrees. At the output port 87, the portions of the signal from the ports 92 and 94 which are 180 degrees in phase constructively combine to produce a replica of the input signal (V2). At the output port 88, the portions of the input signal which are 180 degrees out of phase at 270 degrees and 90 degrees respectively interact to dissipate no power. Thus, the power level at the output port 87 is P, and the power level at the output port 88 is 0.

If the phase shifter 85 introduces a 90 degree phase shift to the replica of the input signal (V2) from the port 83, a replica of the input signal (V2) on the path 89 is provided to the port 92 of the coupler 86 with 90 degrees of phase shift and a power level of P/2. A replica of the input signal with a power level of P/2 is provided to the port 84 with a 90 degree phase shift, and a path 90 provides the signal from the port 84 to the port 94. The signal at the port 92 is split and distributed within the coupler 86 to the output ports 87 and 88. A portion of the signal is provided to the output poll 87 with 90 degrees of phase shift, and a portion of the signal is provided to the output port 88 with a phase shift of ninety degrees for a total phase shift of 180 degrees. The signal at the port 94 is also split and distributed within the coupler 86 to the output ports 87 and 88. A portion is provided to the output port 88 without being phase shifted for a total phase shift of 90 degrees, and a portion of the signal is provided to the output port 87 after being phase shifted by ninety degrees for a total phase shift of 180 degrees. At the output port 87, the portions of the input signal from the ports 92 and 94 which are 90 degrees out of phase at 90 and 180 degrees respectively vectorially combine ninety degrees out of phase to produce a signal with a power level at P/2. At the output port 88, the portions of the input signal from the ports 92 and 94, which are also 90 degrees out of phase at 180 and 90 degrees respectively, vectorially combine ninety degrees out of phase to produce a signal at P/2. Thus, by adjusting the relative phase shift introduced by the phase shifter 85 between the replicas of the input signal, signal components of the input signal can be combined in a manner to produce output signals at power levels of varying proportion.

In the variable divider 80 of FIG. 4, when V1=0, the voltage at the port 88 (V7) and the port 87 (V8) are provided by the following:

$$V7 = \frac{V2}{2}e^{j90} + \frac{V2}{2}e^{j(90+\varphi)} \text{ and}$$

$$V8 = \frac{V2}{2}e^{j\varphi} + \frac{V2}{2}e^{j180}.$$

The magnitude of V7 and V8 is given by:

$$|V7| = \sqrt{\left(\frac{V2}{2}\right)^2 + \left(\frac{V2}{2}\right)^2 + 2\cos\varphi} = \frac{V2}{\sqrt{2}}\sqrt{1+\cos\varphi} \text{ and}$$

$$|V8| = \sqrt{\left(\frac{V2}{2}\right)^2 + \left(\frac{V2}{2}\right)^2 + 2\cos(180-\varphi)} = \frac{V2}{\sqrt{2}}\sqrt{1-\cos\varphi}.$$

The power ratio or proportion between the power levels at the two output ports 87 and 88 can be varied by changing the phase shift φ. The power ratio R between the two output ports 87 (V8) and 88 (V7) is given by:

$$R = \frac{P7}{P8} = \frac{|V7|^2}{|V8|^2} = \frac{1+\cos\varphi}{1-\cos\varphi} \Rightarrow \cos\varphi = \frac{R-1}{R+1} \Rightarrow \varphi = a\cos\left(\frac{R-1}{R+1}\right).$$

As such, for an equal split of the input signal, R=1→cos φ=0→φ=90. For a ⅔ and ⅓ split of the input signal, R=2→cos φ=⅓→φ=70.5°.

In this embodiment, the phase of V7 and V8 can be shown as being the same. Where the angle of V7=90°+α, 2α+ω= 180° and ω=180 −φ, 2α+180−φ=180 which leads to α=φ/2.

As such, the angle of V7 is equal to 90 +φ/2. Where the angle of V8=φ+α and 2α+φ=180 which leads to α=90 −φ/2, the angle of V8 becomes 90 +φ/2.

Figure 5:
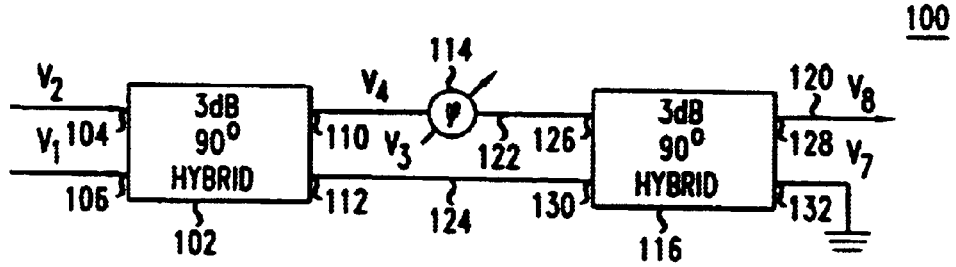
FIG. 5 shows a variable combiner which can be used in the adaptive power amplifier system according to the principles of the present invention.

FIG. 5 shows an embodiment of a variable combiner 100 which can be used in the amplifier network 40 of FIG. 2 as a variable combiner 64*a*–*c*. A coupler 102 receives amplified portion(s) of the input signal on the path 13, (FIG. 2) which was divided into portions by the dividing network 48 (FIG. 2) and amplified. In this embodiment, a first amplified portion is received at a first input port 104 with a power level P1 and a second amplified portion is received at a second input port 106 at a power level P2. The coupler 102 phase shifts and combines replicas, portions or components of the amplified portions at the ports 104 and 106. Depending on the relative phase shifts between the amplified portions and/or between the signals comprising the amplified portions, a phase shifter 114 provides a relative phase adjustment between the signal components at the ports 110 and 112 such that the combination of the signal components of the amplified portions are produced with the appropriate phase relationship between the signal components such that the signal components combine at the output 128 (V8) of the combiner 100 and/or of the combining network 50 (FIG. 2) with low loss and using the desired portion(s), proportion(s) or ratio(s) of the amplified signal portions at the ports 104 and 106. Depending on the embodiment, the relative phase adjustment(s) can reflect the relative phase adjustment(s) introduced between signal components by the variable dividing network 48 (FIG. 2) to ensure that the signal components align in the desired phase relationship at the output port 128 to produce the desired combination of signal components.

In this embodiment, the coupler 102 is a 3 dB. 90 degree hybrid coupler in which a replica of the signal at the input port 104 is combined at the port 110 with a replica of the amplified signal portion at the input port 106 which has been phase shifted by 90 degrees. The replica of the amplified signal portion at the input port 104 is phase shifted by 90 degrees and combined at the port 112 with the a replica of the amplified signal portion at the input port 106. In this embodiment, the phase shifter 114 is on the path 122 and provides a relative phase adjustment between the signal components on the paths 122 from the port 110 and the signal components on a path 124 from the port 112. The phase shifter 114 can be implemented mechanically, for example with a switch to different phase lines or electronically, for example using variable capacitors or varactors.

The phase shifter 114 provides the phase-adjusted combined portions or signal components on the path 122 to a port 126 of the coupler 116, which in this embodiment is a 3 dB 90 degree hybrid coupler. A portion of the power of the signal components at the port 126 is directed to the output port 128 of the coupler 116 along with a portion of the power of the signal components at a port 130 which have been delayed by 90 degrees. The portions of the signal components which are in phase at the output ports constructively combine, and the portions of the signal components that are out of phase at the output port 128 or 132 destructively combine. To prevent power from being dissipated at the output port 132 which simply has a 50 ohm load or termination, the signal components on the paths 122 and 124 are provided with a phase and amplitude relationship such that the voltages cancel at the output port 132 (V7) and substantially all the power is provided to the output port 128 (V8). The phase shifter 114 provides a relative phase shift between the combined portions or signal components on the paths 122 and 124 such that the voltages combine in the proper fashion to produce the output signal at the output port 128 using the desired ratio, portions or proportions of the signal powers at the input ports. Depending on the embodiment, the phase shifter 114 can provide a phase shift which reflects a phase shift provided while replicas of the input signal were being divided by a variable divider. As such, the portions of the signal components or combined portions at the port 126 are combined with portions of the signal components or combined portions at the port 130 such that the combination of the combined signals (of replicas or signal components of the input signal with the same and/or different phases and/or power levels) at the coupler 116 provides an amplified signal at the desired power level (or voltage level) and having components with a desired phase relationship, for example 100% in phase at the output port 128.

In the variable combiner 100 of FIG. 5, $$\left(\frac{|V1|^2}{|V2|^2}\right) = R \Rightarrow |V2| = \frac{1}{\sqrt{R}}|V1|.$$

V7 is composed of two components $V7_1$ and $V7_2$ equal in amplitude and 180 degrees out of phase provided that $\phi$ has been chosen properly (for example, corresponding to the phase shift for the corresponding level of variable divider with ratio R). As a result, the voltage V7 is zero (cancelled out), and all the power is produced at port V8. For instance, $$V7 = \left(\frac{V1}{2} + \frac{V1}{2}e^{j\varphi}e^{j180}\right) + \left(\frac{V2}{2}e^{j90} + \frac{V2}{2}e^{j(90+\varphi)}\right)$$
$$= V7_1 + V7_2.$$

The magnitude of $V7_1$ and $V7_2$ is given by:

$$|V7_1| = \sqrt{\left(\frac{V1}{2}\right)^2 + \left(\frac{V1}{2}\right)^2 + 2\cos(180+\varphi)} = \frac{V1}{\sqrt{2}}\sqrt{1-\cos\varphi} \text{ and}$$

$$|V7_2| = \sqrt{\frac{1}{R}\left(\frac{V1}{2}\right)^2 + \frac{1}{R}\left(\frac{V1}{2}\right)^2 + 2\cos(\varphi)} = \frac{V1}{\sqrt{2}\sqrt{R}}\sqrt{1+\cos\varphi}.$$

The power ratio between the two components is given by:

$$\frac{|V7_1|}{|V7_2|} = \frac{\sqrt{R}\sqrt{1-\cos\varphi}}{\sqrt{1+\cos\varphi}}.$$

For $|V7_1|=|V7_2|$, $$\frac{\sqrt{R}\sqrt{1-\cos\varphi}}{\sqrt{1+\cos\varphi}} = 1 \Rightarrow R = \frac{\sqrt{1+\cos\varphi}}{\sqrt{1-\cos\varphi}} \Rightarrow \cos\varphi = \frac{R-1}{R+1} \Rightarrow \varphi = a\cos\left(\frac{R-1}{R+1}\right).$$

Thus, when $$\varphi = a\cos\left(\frac{R-1}{R+1}\right) \text{ and } |V2| = \frac{1}{\sqrt{R}}|V1|,$$

then $|V7_1|=|V7_2|$. In this embodiment, $V7_1$ and $V7_2$ are 180 degrees out of phase. For $V7_1$, $2\alpha+\phi=180$ which leads to $\alpha=90-\phi$. As such, the angle of $V7_1$ is equal to $\phi/2-90$. For $V7_2$, $180-\phi$ and $2\alpha+\omega=180$, $2\alpha+180=180$ leads to $\alpha=\phi/2$. As such, the angle of $V7_2$ is equal to $90+\alpha$ which is equal to $\phi/2+90$. Thus, the components $V7_1$ and $V7_2$ are 180 degrees out of phase.

In the operation of the variable combiner 100, the amplified portions at the port 110 of the coupler 102 include signal components V2(0 degrees of phase shift) with no phase shift and a power level of P2/2 from the input port 104 and V1 (90 degrees of phase shift) with 90 degrees of phase shift and power level of P1/2 from the second input port 106. At the port 112, the amplified portions include signal components V1(0) with no phase shift and a power level of P1/2 from the input port 106 and V2(90) with 90 degrees of phase shift and power level of P2/2 from the first input port 104. If the phase shifter 114 introduces a 0 degree phase shift to the signal from the port 110, the signal on the path 122 is provided to the port 126 of the coupler 116 with signal components V2(0) and V1(90) and power levels of P2/2 and P1/2 respectively. The signal components at the port 126 is split and distributed within the coupler 116 with signal components V2(0 degrees phase shift) and V1(90 degrees phase shift) to the output port 128 having power levels of P2/4 and P1/4 respectively and signal components V2(90) and V1(180) provided to the output port 132 having power levels of P2/4 and P1/4 respectively. The signal at the port 130 from the port 112 is also split and distributed within the coupler 116 to the output ports 128 and 132 with signal components V2(180) and V1(90) to the output port 128 having power levels of P2/4 and P1/4 respectively. At the output port 128, the signal components V2 are 180 degrees out of phase and dissipate no power while the V1 components are in phase and constructively combine to produce V1 at a power level P1. At the output port 132, the signal components V1 are 180 degrees out of phase and dissipate no power while the V2 components are in-phase and constructively combine. As such, if there is no amplified signal portions at the input port 104 and the signal V1 at the input port 106, then all the power can be taken from the input port 106 and produced in the output port 128.

If the phase shifter 114 introduces a 180 degree phase shift to the signal from the port 110, the signal on the path 122 is provided to the port 126 of the coupler 116 with signal components V2(180) and V1(270) and power levels of P2/2 and P1/2 respectively. The signal components at the port 126 is split and distributed within the coupler 116 with signal components V2(180 degrees phase shift) and V1(270 degrees phase shift) to the output port 128 having power levels of P2/4 and P1/4 respectively and signal components V2(270) and V1(0) provided to the output port 132 having power levels of P2/4 and P1/4 respectively. The signal at the port 130 from the port 112 is also split and distributed within the coupler 116 to the output ports 128 and 132 with signal components V2(180) and V1(90) to the output port 128 having power levels of P2/4 and P1/4 respectively. At the output port 128, the signal components V1 are 180 degrees out of phase and dissipate no power while the V2 components are in phase and constructively combine to produce V2 at a power level of P2. At the output port 132, the signal components V2 are 180 degrees out of phase and dissipate no power while the V1 components are in-phase and constructively combine. As such, if there is no amplified signal portions at the input port 106 and the signal V2 at the input port 104, then all the power can be taken from the input port 104 and produced at the output port 128.

If the phase shifter 114 introduces a 90 degree phase shift to the signal from the port 110, the signal on the path 122 is provided to the port 126 of the coupler 116 with signal components V2(90) and V1(180) and power levels of P2/2 and P1/2 respectively. The signal components at the port 126 is split and distributed within the coupler 116 with signal components V2(90 degrees phase shift) and V1(180 degrees phase shift) to the output port 128 having power levels of P2/4 and P1/4 respectively and signal components V2(180) and V1(270) provided to the output port 132 having power levels of P2/4 and P1/4 respectively. The signal at the port 130 from the port 112 is also split and distributed within the coupler 116 to the output ports 128 and 132 with signal components V2(180) and V1(90) to the output port 128 having power levels of P2/4 and P1/4 respectively. At the output port 128, the signal components V2 are at 90 degrees out of phase, and the V1 components are 90 degrees out of phase. At the output port 132, the signal components V2 are 90 degrees out of phase, and the V1 components are 270 degrees out of phase. As such, if the signal V2 at the input port 104 is equal in power to the signal V1 at the input port 106, then the power for the signal to be produced at the output port 128 can be taken in equal portions from both the input ports 104 and 106. By adjusting the relative phase shift introduced by the phase shifter 114 between the signal components on the paths 122 and 124, the signal at the output port 128 can be produced using changing portions or ratios of the input signal powers.

In addition to the embodiment described above, alternative configurations of the power amplification architecture according to the principles of the present invention are possible which omit and/or add components and/or use variations or portions of the described system. The power amplification system according to principles of the present invention can operate with other power amplifier architectures which use different structures and use correction amplifier(s) or other amplifiers to reduce the nonlinear distortion of the signal. For example, the power amplification system has been described as using variable couplers comprising 90 degree 3 dB hybrid couplers, but other variable couplers can be used or combinations of conventional couplers and variable couplers. Additional amplifier stages can be used to amplify replicas of the original signal which are recombined to produce the amplified signal. Other architectures are possible which use combinations of the above described architectures and/or techniques for amplifying a signal in a more efficient and/or linear fashion.

Furthermore, the power architecture system has been described as detecting certain upstream signal information, but other parameters or characteristics of the signal to be amplified can be detected along with the upstream signal information or as the upstream signal information, or no information of the upstream signal is detected, the power amplifier architecture is simply placed in a desired configuration, for example for replacement or repair of an amplifier stage. The system has also been described as shutting off or on particular amplifier stage(s), but the amplifier stage(s) which shut off or on can be rotated or changed in any desired manner. The system has been described as using a variable coupler arrangement, but other components or arrangements thereof, which can include splitters, couplers, summers and/or sampling devices, can be used to perform the same function(s) or similar functions. The power amplifier architecture has been further described as using different configurations using discrete components, but it should be understood that the architecture and portions thereof can be implemented in application specific integrated circuits, software-driven processing circuitry, firmware or other arrangements of discrete components as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of amplifying an input signal with a plurality of amplifier stages, said method comprising:

receiving said input signal with a variable power dividing network and dividing said input signal to produce a changing portion of said input signal to said at least one active amplifier stage; and receiving amplified portions from said at least one active amplifier stage with a variable combining network where the amplified portions are used in varying proportions to produce an amplified output signal.

2. The method of claim 1 further including:

obtaining upstream signal information wherein said changing occurs in response to said upstream signal information.

3. The method of claim 2 wherein said obtaining including:

obtaining as said upstream signal information upstream signal configuration information comprising at least one of the number of carriers comprising the signal to be amplified, the type of carriers, the number of users, the average power per carrier, a peak power of said signal and a total average power of said signal.

4. The method of claim 1 comprising:

providing portions of said input signal to N active amplifier stages which amplify portions to produce N amplified portions which are combined to produce an amplified signal;

changing to M active amplifier stages where M is not equal to N; and wherein said changing, amplifying and using including:

changing said portions of said input signal being provided to said M active amplifier stages;

amplifying by said M active amplifier stages said portions to produce M amplified portions; and combining said M amplified portions in different proportions to produce said amplified signal.

5. The method of claim 4 wherein said changing including:

turning "on" or "off" amplifier stages.

6. The method of claim 5 wherein said turning "on" or "off" including:

adjusting at least one bias voltage to said amplifier.

7. The method of claim 1 including:

providing portions of said input signal to N active amplifier stages which amplify said portions to produce N amplified portions which are combined to produce an amplified signal, said method further comprising:

changing the operation of said N active amplifier stages; and wherein said changing, amplifying and using including:

changing said portions of said input signal being provided to said N active amplifier stages;

amplifying by said N active amplifier stages said portions to produce N amplified portions; and combining said N amplified portions in different proportions to produce said amplified signal.

8. The method of claim 7 wherein said changing including:
adjusting at least one bias voltage to said amplifier.

9. The method of claim 1 wherein said changing including:
providing said input signal to a variable dividing network; and
dividing said input signal into at least one portion where said at least one portion depends on relative phase shifts provided between signal components used to construct said at least one portion.

10. The method of claim 9 wherein said variable dividing network includes at least one variable divider including:
coupling onto first and second paths signal components of a signal received at the input to said variable divider;
providing a relative phase shift between said signal components on said first and second paths; and
distributing said signal components on said first and second paths to first and second output ports in proportions depending on said relative phase shift.

11. The method of claim 10 wherein said coupling includes:
using a 90 degree 3 dB hybrid coupler; and wherein said distributing includes:
using a 90 degree 3 dB hybrid coupler.

12. A method of producing an amplified signal with a plurality of amplifier stages, said method comprising:
combining at least one varying proportion of at least one amplified signal portion from a variable power divider coupled to at least one active amplifier stage.

13. The method of claim 12 wherein said combining includes at least one variable combiner including:
coupling onto first and second paths signal components of said amplified portions received at input ports to said variable combiner;
providing a relative phase shift between said signal components on said first and second paths; and
distributing said signal components on said first and second paths to an output port in proportions depending on said relative phase shift.

14. The method of claim 12 comprising:
changing a portion of said signal being provided to said at least one active amplifier stage.

15. A power amplification system, said system comprising:
an amplifier having at least one active amplifier stage;
a variable dividing network configured to divide an input signal and produce a changing portion of said input signal to said at least one active amplifier stage; and
a variable combining network configured to receive amplified portions from said at least one active amplifier and using the amplified portions in varying proportions to produce an amplified output signal.

16. The system of claim 15 further including:
processing circuitry providing phase shift control signals to said variable dividing network and said variable combining network in response to upstream signal information.

17. The system of claim 15 wherein said amplifier having a first configuration including N active amplifier stages which amplify said portions to produce N amplified portions which are combined to produce an amplified signal, said amplifier having at least a second configuration of M active amplifier stages where M is not equal to N, said variable dividing network configured to change said portions of said input signal being provided to said M active amplifier stages, said M active amplifier stages amplify said portions to produce M amplified portions, and said variable combining network receives said M amplified portions and combines said M amplified portions in different proportions to produce said amplified signal.

18. The system of claim 15 wherein said amplifier having a first configuration including N active amplifier stages which amplify said portions to produce N amplified portions which are combined to produce an amplified signal, said amplifier having at least a second configuration where said N active amplifier stages operate differently, said variable dividing network configured to change said portions of said input signal being provided to said N active amplifier stages, said N active amplifier stages amplify said portions to produce N amplified portions, and said variable combining network receives said N amplified portions and combines said M amplified portions in different proportions to produce said amplified signal.

19. The system of claim 15 wherein said variable dividing network responsive to phase shift controls provided between signal components to change said at least one portion.

20. The system of claim 15 wherein said variable dividing network includes at least one variable divider including:
a first coupler receiving a signal and coupling onto first and second paths signal components of said signal;
a phase shifter providing a relative phase shift between said signal components on said first and second paths; and
a second coupler receives said signal components with said relative phase shift on said first and second paths to first and second output ports in proportions depending on said relative phase shift.

21. The system of claim 20 wherein said first coupler and said second coupler are 90 degree 3 dB hybrid couplers.

22. A power amplification system, said system comprising:
a variable combining network configured to receive at least one amplified portion from at least one active amplifier stage and using the amplified portion in varying proportions to produce an amplified output signal; and
a variable dividing network configured to divide an input signal and produce a changing portion of said input signal to said at least one active amplifier stage.

23. The system of claim 22 wherein said variable combining network includes at least one variable combiner including:
a first coupler receives signal portions from two input ports and couples said signal components of said signal portions onto first and second paths;
a phase shifter providing a relative phase shift between said signal components on said first and second paths; and
a second coupler distributes said signal components with said relative phase shift on said first and second paths at an output port in proportions depending on said relative phase shift.

* * * * *